(12) United States Patent
Lu et al.

(10) Patent No.: US 7,791,422 B2
(45) Date of Patent: Sep. 7, 2010

(54) VOLTAGE CONTROLLED OSCILLATOR WITH CASCADED EMITTER FOLLOWER BUFFER STAGES

(75) Inventors: Yumin Lu, Chelmsford, MA (US); Ian Gresham, Somerville, MA (US)

(73) Assignee: Autoliv ASP, Inc., Ogden, UT (US)

( * ) Notice: Subject to any disclaimer, the term of this patent is extended or adjusted under 35 U.S.C. 154(b) by 98 days.

(21) Appl. No.: 11/873,793

(22) Filed: Oct. 17, 2007

(65) Prior Publication Data

US 2009/0102568 A1    Apr. 23, 2009

(51) Int. Cl.
*H03B 7/06* (2006.01)

(52) U.S. Cl. .......................... 331/74; 331/66; 331/167; 331/185

(58) Field of Classification Search .................. 331/66, 331/74, 167, 185
See application file for complete search history.

(56) References Cited

U.S. PATENT DOCUMENTS

| | | | |
|---|---|---|---|
| 4,195,274 A | 3/1980 | Suganuma | |
| 4,843,265 A | 6/1989 | Jiang | |
| 5,245,298 A | 9/1993 | Pham | |
| 5,254,955 A | 10/1993 | Saeki et al. | |
| 5,434,544 A * | 7/1995 | Van Veenendaal | 331/117 R |
| 5,440,276 A | 8/1995 | Kim | |
| 5,546,088 A | 8/1996 | Trummer et al. | |
| 5,621,362 A | 4/1997 | McKinney et al. | |
| 5,650,754 A | 7/1997 | Joshi et al. | |
| 5,847,614 A | 12/1998 | Gilbert et al. | |
| 5,986,514 A | 11/1999 | Salvi et al. | |
| 6,081,166 A * | 6/2000 | Katakura | 331/57 |
| 6,204,784 B1 | 3/2001 | Hatfield | |
| 6,417,740 B1 | 7/2002 | Anh et al. | |
| 7,167,058 B2 | 1/2007 | Meltzer | |
| 7,400,209 B2 * | 7/2008 | Veenstra et al. | 331/177 V |
| 2005/0023197 A1 | 2/2005 | Tariq | |

OTHER PUBLICATIONS

International Search Report, International Application No. PCT/US2008/080165, International Publication No. WO 2009/052289, Mailed: Feb. 12, 2009, Applicant: Autoliv ASP, Inc., Voltage Controlled Oscillator with Cascaded Emitter Follower Buffer Stages, (3) pgs.

* cited by examiner

*Primary Examiner*—Robert Pascal
*Assistant Examiner*—James E Goodley
(74) *Attorney, Agent, or Firm*—Sally J Brown; The Small Patent Law Group LLP

(57) ABSTRACT

A voltage controlled oscillator (VCO) is provided that includes an output buffer having a first buffer stage including a first transistor and a second buffer stage including a second transistor. The first and second transistors are connected in a cascaded emitter follower buffer arrangement.

20 Claims, 3 Drawing Sheets

VOLTAGE CONTROLLED OSCILLATOR WITH CASCADED EMITTER FOLLOWER BUFFER STAGES

BACKGROUND OF THE INVENTION

This invention relates generally to voltage controlled oscillators (VCOs), and more particularly, to a VCO having cascaded emitter follower buffer stages.

VCOs typically have to operate in narrow frequency bands. For example, in some Industrial, Scientific and Medical (ISM) applications VCOs may have to operate in a 120 MHz frequency window. VCOs are typically phase locked to an input signal using a phase locked loop (PLL) that includes a feedback to control the output frequency of the VCO. The PLL maintains the VCO in the narrow frequency band.

VCOs are used in many different applications. For example, VCOs are used in transmitters to control the operating frequency of the transmitters. In high frequency applications, for example, when using a 24 GHz VCO, such as, used in automotive or other short range radars, isolation between the VCO and the other portions of the transmitter is an issue. When proper isolation is not provided, the frequency of the VCO is changed, often referred to as frequency pulling, as a result of varying load conditions. The varying load conditions may be caused, for example, by a change in environmental conditions, such as from varying reflections from a changing environment near the antenna, or by other circuits connected to the VCO changing the operating mode or state. For example, the turning on/off of the switches in a pulsed radar transmitter may vary the load impedance presented to the VCO. These changes in load-impedance (and hence frequency) can occur within nanoseconds at a rate that the PLL cannot correct. The operating frequency of the VCO will thus be affected and that may cause the VCO to operate outside of a desired or required frequency band, as well as having other affects on circuit performance, which may be less detectable.

It is known to provide isolation for a VCO in a transmitter application using a cascode output configuration or using buffer stages. For example, a plurality of buffer stages may be added in a serial arrangement to provide isolation of the VCO. These buffer stages provided in a serial arrangement increase the amount of current needed due to each stage requiring a bias current. As a result of the increased current, direct current (DC) consumption is increased, thereby increasing the amount of DC power needed. The increased current also results in an increase in temperature of the VCO, which in applications that present harsh thermal environments may result in unacceptable operation of the VCO (e.g., VCO operating outside of required frequency band). Thus, although isolation of VCOs may be provided using these known methods, the overall operation of the system may be adversely affected.

BRIEF DESCRIPTION OF THE INVENTION

In accordance with an exemplary embodiment, an output buffer for a voltage controlled oscillator (VCO) is provided. The output buffer includes a first buffer stage including a first transistor and a second buffer stage including a second transistor. The first and second transistors are connected in a cascaded emitter follower buffer arrangement.

In accordance with another exemplary embodiment, a voltage controlled oscillator is provided that includes an output buffer and a pull-down resistor network configured to generate an internal bias voltage operable to initiate oscillation in the absence of a signal from a charge pump of phase locked loop.

In accordance with yet another exemplary embodiment, a method for controlling a voltage controlled oscillator (VCO) is provided. The method includes configuring a first stage of an output buffer for the VCO in a cascaded configuration with a second stage of the output buffer. The method further includes isolating an output of the VCO using the first and second stages of the buffer.

DETAILED DESCRIPTION OF THE INVENTION

For simplicity and ease of explanation, the invention will be described herein in connection with various embodiments thereof. Those skilled in the art will recognize, however, that the features and advantages of the various embodiments may be implemented in a variety of configurations. It is to be understood, therefore, that the embodiments described herein are presented by way of illustration, not of limitation.

As used herein, an element or step recited in the singular and proceeded with the word "a" or "an" should be understood as not excluding plural said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property. Additionally, the arrangement and configuration of the various components described herein may be modified or change, for example, replacing certain components with other components or changing the order or relative positions of the components.

Various embodiments of the present invention provide a voltage controlled oscillator (VCO) having a cascaded emitter follower buffer configuration. The VCO also includes a resistor network (shown in FIG. 3) to provide self-oscillation of the VCO under certain conditions. A temperature bias control (shown in FIG. 4) that is counter proportional to temperature is also provided in combination with the VCO.

Figure 1:
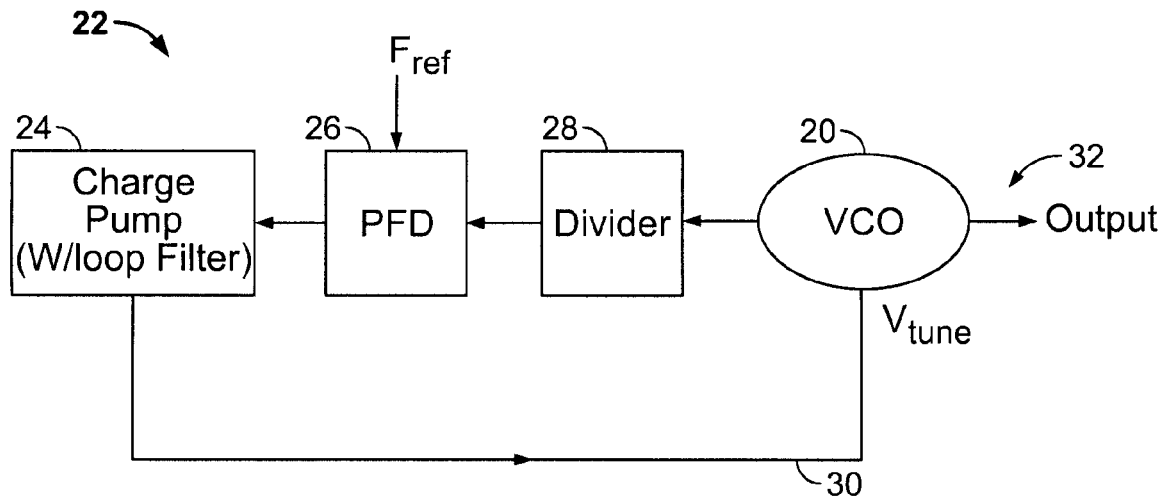
FIG. 1 is a block diagram of a phase locked loop (PLL) including a voltage controlled oscillator (VCO) constructed in accordance with various embodiments of the invention.

In various embodiments, a VCO 20 is provided that may form part of a phase locked loop (PLL) 22 as shown in FIG. 1. The PLL 22 includes a charge pump 24, the input of which is connected to the output of a phase frequency detector (PFD) 26. The input of the PFD 26 is connected to the output of a frequency divider 28. The input of the frequency divider 28 is connected to the VCO 20. A loop 30 is also provided from the output of the charge pump 24 to the control input of the VCO 20.

It should be noted that although the VCO 20 is described in connection with the PLL 22 shown in FIG. 1, the VCO 20 may be provided in connection with different PLLs having different components parts. The VCO 20 also may be used in different applications having different operating requirements. For example, the VCO 20 may be used as part of a PLL in radio, telecommunications, computers and other electronic applications to generate stable frequencies (e.g., a frequency synthesizer) or to recover a signal from a noisy communication channel. The PLL 22 may be implemented in hardware, for example, a single integrated circuit chip, in software, or in combination thereof.

In operation, the phase of the VCO 20 at an output 32 is locked using the PLL 22 and based on an input signal, for example, an input frequency signal (Fref) received at the PFD 26. The PLL 22 is essentially an electronic control system that generates a signal that is locked to the phase of the input or reference signal. The PLL 22 responds to both the frequency and the phase of the input signal and automatically increases or decreases the frequency of the VCO 20 until the output frequency of the VCO 20 is matched to the reference signal (times a divider ratio) in both frequency and phase (which may include an acceptable deviation). It should be noted that the VCO 20 generates a periodic output signal and the charge pump 24 sends a control signal to the VCO 20 based on feedback from the loop 30. For example, if initially the VCO 20 is at about the same frequency as the reference signal (times the divider ratio), then if the phase from the VCO 20 falls behind, the control voltage of the charge pump 24 is changed based on the change in frequency as detected by the PFD 26. The frequency of the VCO 20 is accordingly increased (e.g., oscillation speeds up). If the phase moves ahead, the control voltage is again changed, but to decrease the frequency of the VCO 20 (e.g., oscillation slows down).

Figure 2:
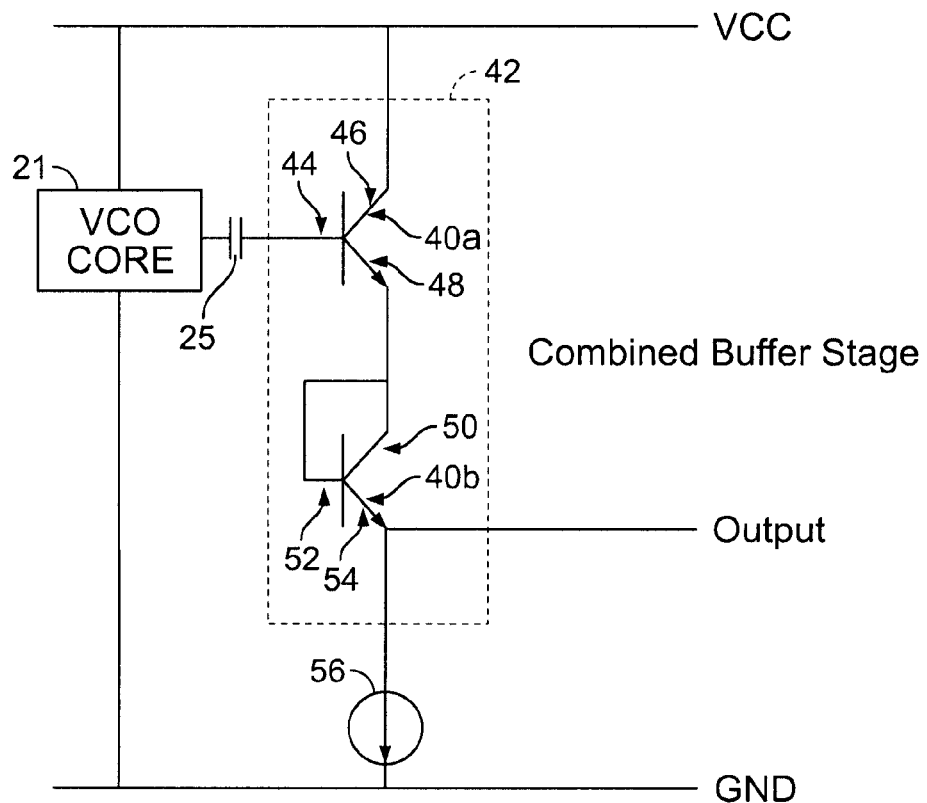
FIG. 2 is a schematic block diagram of an output buffer for a voltage controlled oscillator (VCO) having a cascaded configuration constructed in accordance with various embodiments of the invention.

The VCO 20 includes a plurality of transistors 40a and 40b provided in a cascaded configuration that defines a combined buffer stage 42 as shown in FIG. 2 (illustrating a more detailed partial schematic of the VCO 20). In particular, the transistors 40a and 40b are connected in a parallel arrangement series and forming parallel buffer stages that are connected to a VCO core 21. For example, the two transistors 40a and 40b are connected in parallel such that the first transistor 40a defines a first buffer stage connected in parallel with the second transistor 40b that defines a second buffer stage. It should be noted that additional transistors 40a and 40b may be added to the cascaded configuration to thereby define additional buffer stages 42.

The transistors 40a and 40b may be, for example, bipolar junction transistors (BJTs) provided in an NPN configuration. In this configuration, a base 44 of the first transistor 40a is connected to the output of the VCO core 21 through a capacitor 25 and a collector 46 of the first transistor 40a is connected to power (e.g., 5 volt also designated and commonly referred to as Vcc). An emitter 48 of the first transistor 40a is connected to a collector 50 of the second transistor 40b. A base 52 of the second transistor 40b is connected to the collector 50 of the second transistor 40b. An emitter 54 of the second transistor 40b is connected to ground through a current source 56. An output is provided at the emitter 54 of the second transistor 40b. Accordingly, in the illustrated embodiments, the transistors 40a and 40b are provided in a common emitter/source follower arrangement that isolates the VCO core 21 from the output. Thus, both stages of the combined buffer stage 42, namely the transistors 40a and 40b share the same current.

Also, the buffer stages are AC coupled to the VCO core 21. In a conventional emitter follower arrangement, the reverse isolation is determined by the intrinsic base/emitter junction capacitance of the transistor(s). In the cascaded configuration of the various embodiments, the reverse isolation is determined by the series combination of two intrinsic base/emitter junction capacitances. Accordingly, this arrangement reduces the capacitance by half and thus doubles the reverse isolation if transistors 40a and 40b are of the same size. The output voltage swing in this cascaded configuration is the same as that in the conventional emitter follower such that the loss through the buffer stage is minimized. At the same time, the two transistors 40a and 40b use a common bias current. Therefore, this arrangement consumes the same DC power as the conventional emitter follower while providing improved reverse isolation.

Figure 3:
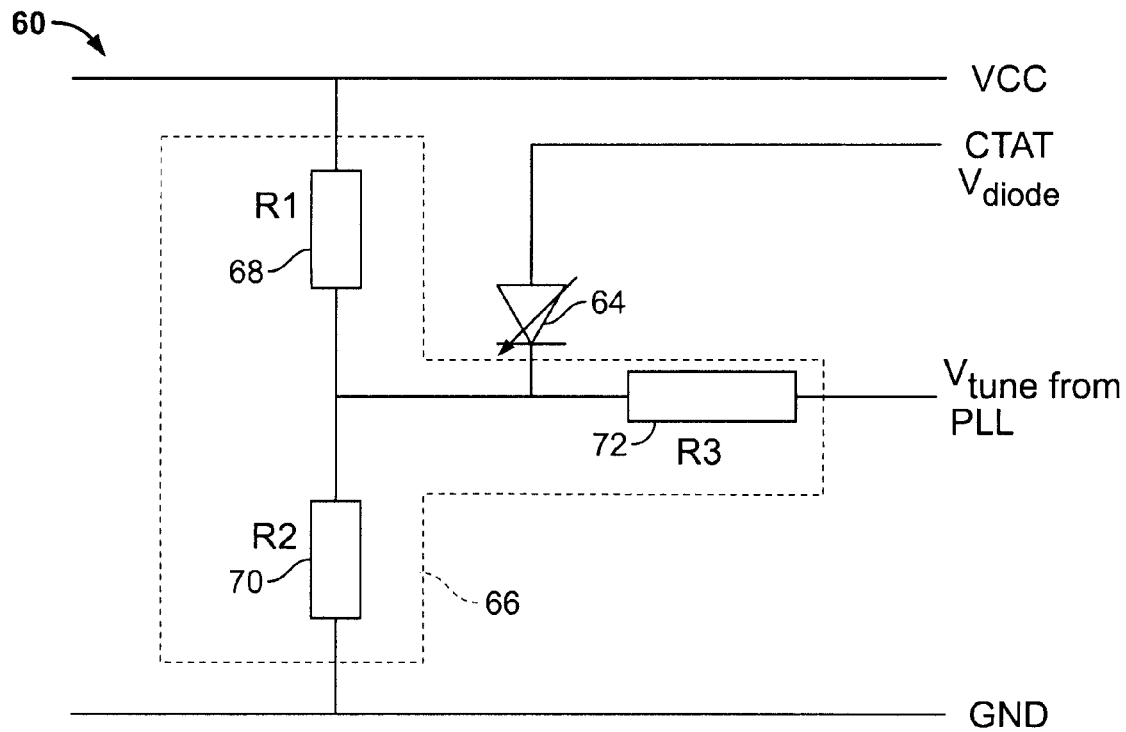
FIG. 3 is a schematic block diagram of a resistor network for a VCO constructed in accordance with various embodiments of the invention.

In various embodiments, the VCO core 21 includes a varactor bias network 60 as shown in FIG. 3. It should be noted that only half of the differential circuit is shown. The varactor bias network 60 includes a varactor-diode 64 that is essentially a diode that has a variable capacitance that is a function of the voltage applied to the terminals of the varactor-diode 64, for example, a complementary to absolute temperature (CTAT) Vdiode voltage as described in more detail below. The varactor bias network 60 in accordance with various embodiments includes a pull-down resistor network 66 having a first resistor 68, a second resistor 70 and a third resistor 72. In this resistor network 66, the first and second resistors 68 and 70 form a voltage divider with one end of the third resistor 72 connected between the first and second resistors 68 and 70. The other end of third resistor 72 is connected to a control voltage (Vtune) from the PLL 22, for example, a control voltage from the charge pump 24. The first and second resistors 68 and 70 are connected between Vcc (e.g., 5 volts) and ground (GND).

It should be noted that the voltage applied to the varactor-diode 64 is variable. In various embodiments, the voltage applied to the varactor-diode 64 is counter proportional to changes in temperature as described in more detail below.

In operation, the resistor network 66 of the varactor bias network 60 (which forms part of the VCO core 21 shown in FIG. 2) ensures that the VCO 20 does not enter a dead lock condition if no signal is received from the charge pump 24. In particular, the Quality-factor of the varactor-diode 64 decreases as the reverse bias on the varactor-diode 64 decreases. Under some operation conditions, for example, when the varactor-diode 64 is only slightly reversed biased (e.g., less than 0.5 volts of reverse bias voltage), the VCO 20 may not be able to start proper oscillation. When this occurs, the VCO 20 typically will enter a dead lock condition if the PLL 22 does not send a proper voltage to activate the VCO 20. In the various embodiments when this condition occurs, where the charge pump 24 sends no signal to the VCO 20 (e.g., Vtune in FIG. 3 is floating), the varactor-diode 64 will be biased, for example, to 2 volts internally to begin oscillation of the VCO 20. The voltage is determined by the values of the resistors 68, 70 and 72 of the resistor network 66. Thereafter, once the oscillation of the VCO 20 begins and the PFD 26 receives an RF signal from the VCO 20 as a result of the oscillation, the PLL 22 will begin normal operation. The PLL 22 essentially starts operating based on the internal voltage generated by the varactor bias network 60 having the resistor network 66. The varactor-diode 64 will then be biased at the proper voltage according to the voltage from the charge pump 24 and the resistor ratios of the resistor network 66. Thus, self-starting or self-oscillating operation is provided.

Figure 4:
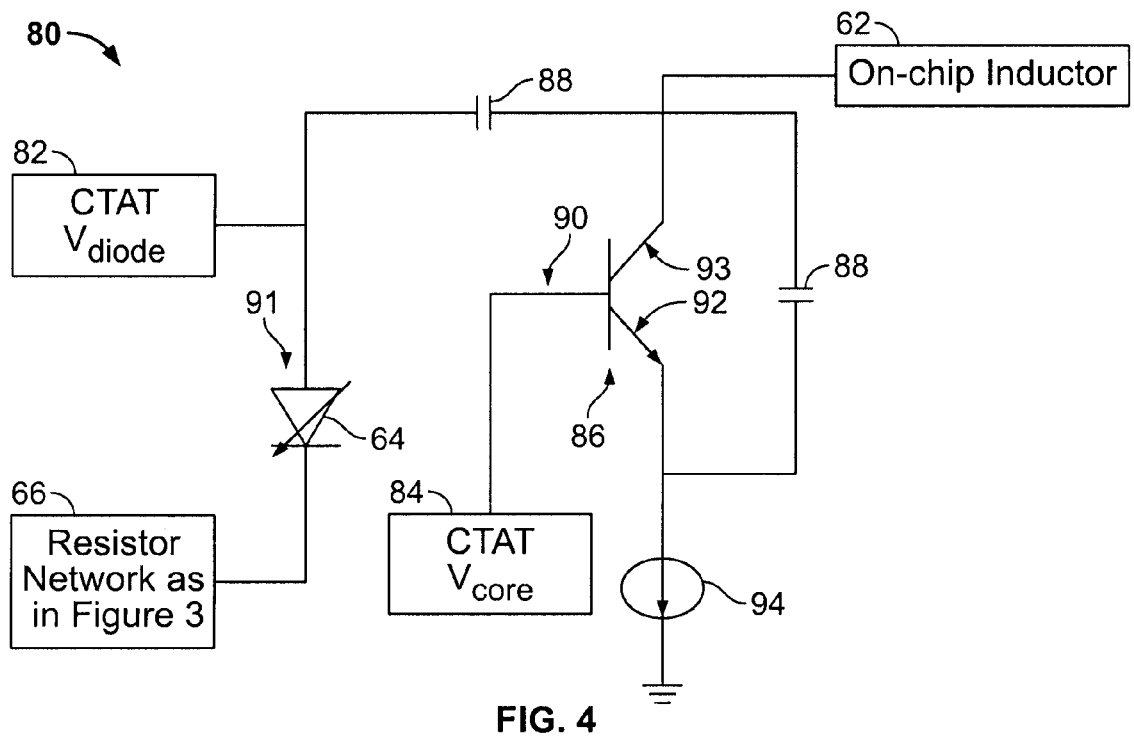
FIG. 4 is a schematic block diagram of a temperature bias circuit for a VCO constructed in accordance with various embodiments of the invention.
Figure 5:
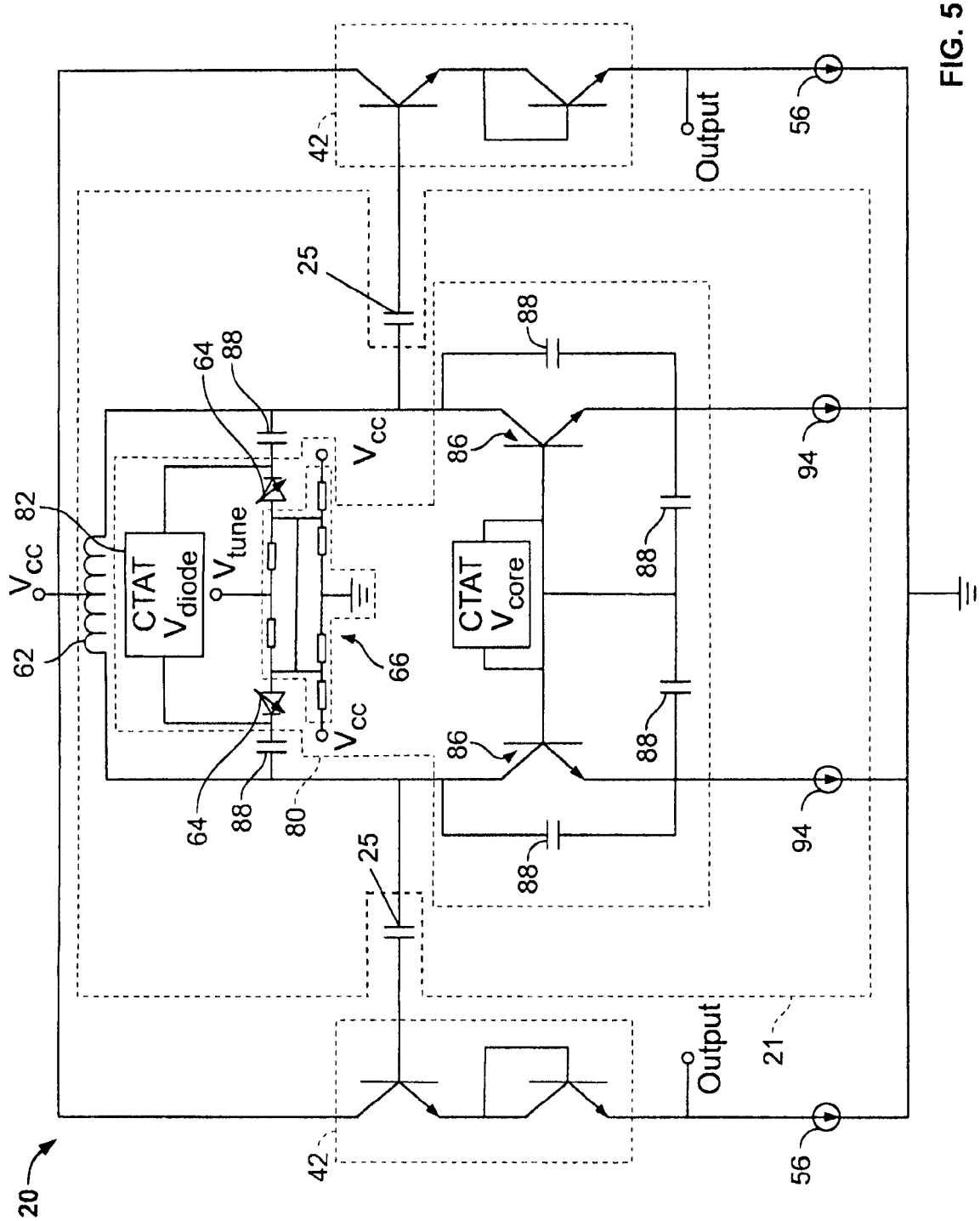
FIG. 5 is a schematic block diagram of a VCO constructed in accordance with various embodiments of the invention.

Various embodiments of the invention also provide a temperature bias circuit 80 as shown in FIG. 4 that also forms part of the VCO core 21 (shown in FIG. 2). It should be noted that only half of the differential circuit is shown in FIG. 4. In particular a control voltage, illustrated as a compensated bias voltage 82 (e.g., complementary to absolute temperature (CTAT) Vdiode voltage) is applied to the varactor-diode 64 and another control voltage, illustrated as a compensated bias voltage 84 (CTAT Vcore) is applied to a transistor 86 (e.g., a heterojunction bipolar transistor (HBT) transistor), which is the core transistor of the VCO core 21 as shown in FIG. 5. A plurality of capacitors 88 are also included to provide AC coupling. In operation, a CTAT voltage created as the build-in potential in a semiconductor p-n junction is counter proportional to the temperature as described below. An emitter 92 of the transistor 86 is also connected through a current source 94 to ground and a collector 93 of the transistor 86 is connected to an inductor 62.

In operation, as temperature increases, the junction capacitance of the transistor 86 and the varactor-diode 64 increases as a result of the build-in potential (φ) of the pn junction in these devices decreasing and as defined in the following equation:

$$C = \left[ \frac{q\varepsilon_s}{2\left(\frac{1}{N_a} + \frac{1}{N_d}\right)(\varphi + V_{reverse\text{-}bias})} \right]^{1/2} \quad \text{Equation 1}$$

Where C is the junction capacitance, $N_a$ and $N_d$ are the doping concentrations of the p-type and n-type semiconductor, φ is the build-in potential across the p and n regions, $V_{reverse\text{-}bias}$ is the reverse bias applied on the p-n junction, $\varepsilon_s$ is the surface potential and q is the electron charge.

In order to compensate for this effect, the CTAT bias circuit 80 is used to bias a base 90 of the transistor 86 and an anode 91 of the varactor-diode 64. The compensation is counter proportional to temperature. For example, as temperature increases the CTAT voltage decreases as based on predetermined values (e.g., values based on empirical analysis and/or circuit simulations). Thus, the bias voltages of the transistor 86 and varactor-diode 64 are adjusted to minimize the change in junction capacitance, which determines the frequency shift over temperature.

Thus, a VCO 20 is provided as shown in FIG. 5, illustrating a complete schematic of the VCO 20 having the VCO core 21, the combined buffer stage 42 (also shown in FIG. 2), the resistor network 66 (also shown in FIG. 3), and the temperature bias circuit 80 (also shown in FIG. 4). The VCO 20 may be provided, for example, on a single chip (e.g., integrated circuit chip) and have a differential circuit design. It should be noted that FIG. 5 shows both halves of the differential circuit. The VCO 20 includes output buffers having a cascaded emitter follower configuration that defines a combined buffer stage 42 of transistors connected in parallel and connected to the VCO core 21. This output buffer configuration provides improved isolation without increasing DC power requirements. The VCO core 21 also includes a pull-down resistor network 66 that ensures that the PLL 22 does not enter a dead lock condition when no signal is received from the charge pump 24. Accordingly, a self-starting VCO 20 is provided. Additionally, a counter proportional temperature compensation is provided to both the varactor-diode 64 and the transistor 86 to provide improved compensation for temperature shift.

It should be noted that modifications and variations to the various embodiments are contemplated. For example, the number, relative positioning and operating parameters of the various components may be modified based on the particular application, use, etc. The modification may be based on, for example, different desired or required operating characteristics.

Accordingly, it is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description.

The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. An output buffer for a voltage controlled oscillator (VCO), the output buffer comprising:
    a first buffer stage including a first transistor;
    a second buffer stage including a second transistor, wherein the first and second transistors are connected in a parallel cascaded emitter follower buffer arrangement, which is in parallel with the VCO; and
    wherein the cascaded emitter follower buffer arrangement includes a single bias current source connected directly to one of the first and second transistors and the cascaded emitter follower buffer arrangement provides reverse isolation.

2. An output buffer in accordance with claim 1 wherein the first and second transistors are connected in a common emitter/source follower configuration.

3. An output buffer in accordance with claim 1 wherein an emitter of the first transistor is connected to a collector of the second transistor.

4. An output buffer in accordance with claim 1 wherein a base of the first transistor is connected to an output of the VCO.

5. An output buffer in accordance with claim 1 wherein the first and second transistors are configured for operation at about 24 GHz.

6. An output buffer in accordance with claim 1 wherein a base of the second transistor is connected to a collector of the second transistor.

7. A method for controlling a voltage controlled oscillator (VCO), the method comprising:

configuring a first stage of an output buffer for the VCO in a parallel cascaded emitter follower configuration with a second stage of the output buffer, wherein the first and second stages are in parallel with the VCO;

biasing the first and second stages of the output buffer using a single current source directly connected to one of the first and second stages; and providing reverse isolation of isolating an output of the VCO using the first and second stages of the buffer.

8. A method in accordance with claim 7 further comprising self-starting the VCO when a bias signal is not provided from a charge pump.

9. A method in accordance with claim 7 further comprising providing temperature compensation bias voltages to a varactor-diode and a transistor of an LC-resonator of the VCO.

10. A method in accordance with claim 9 further comprising applying counter proportional temperature compensation bias voltages.

11. An output buffer in accordance with claim 1 wherein the parallel cascaded emitter follower buffer arrangement forms parallel buffer stages.

12. An output buffer in accordance with claim 1 wherein the first and second buffer stages use a common bias current.

13. An output buffer in accordance with claim 1 wherein the first and second buffer stages together form a combined buffer stage.

14. An output buffer in accordance with claim 1 wherein a collector of the second transistor is connected to an emitter of the first transmitter and a base of the second transistor is connected only to the collector of the second transistor.

15. An output buffer in accordance with claim 1 wherein one end of the second buffer stage is connected to an emitter of the first transistor and another end of the second buffer stage is connected to an output node and a current source.

16. An output buffer in accordance with claim 1 wherein the first and second buffer stages share the single bias current source.

17. An output buffer in accordance with claim 1 wherein the single bias current source is connected directly to an emitter of the second transistor.

18. An output buffer in accordance with claim 1 further comprising an output connected between the single bias current source and one of the first and second transistors.

19. An output buffer in accordance with claim 1 further comprising an output connected to an emitter of the second transistor.

20. An output buffer in accordance with claim 1 further comprising an output and wherein the single bias current source and the output are connected to a common node.

* * * * *